310-335 SR

9/9/86 XR 4,611,141

United States Patent [19]

Hamada et al.

[11] Patent Number: 4,611,141

[45] Date of Patent: Sep. 9, 1986

[54] LEAD STRUCTURE FOR A PIEZOELECTRIC ARRAY-TYPE ULTRASONIC PROBE

[75] Inventors: Akira Hamada; Akira Funakoshi; Keiichi Ohira, all of Iwaki, Japan

[73] Assignee: Kureha Kagaku Kogyo Kabushiki Kaisha, Tokyo, Japan

[21] Appl. No.: 703,383

[22] Filed: Feb. 20, 1985

[30] Foreign Application Priority Data

Mar. 5, 1984 [JP] Japan ............................ 59-30616[U]

[51] Int. Cl.[4] ............................................. H01L 41/08

[52] U.S. Cl. ............................... 310/334; 174/52 FP; 361/404; 310/335; 310/365

[58] Field of Search ............... 310/334, 335, 336, 348, 310/351-353, 365; 174/52 FP; 361/404, 405

[56] References Cited

U.S. PATENT DOCUMENTS 3,849,681 11/1974 Scott, Jr. et al. ............... 310/353 X
4,424,465 1/1984 Ohigashi et al. .................... 310/335
4,467,237 8/1984 Piaget et al. ..................... 310/335 X
4,486,681 12/1984 Ishigami et al. .................... 310/353

*Primary Examiner*—Mark O. Budd
*Attorney, Agent, or Firm*—Wenderoth, Lind & Ponack

[57] ABSTRACT

An array-type ultrasonic probe for an ultrasonic transducer has a basic structure comprising a substrate on which are successively disposed a plurality of parallel stripe form back electrodes, a polymer piezoelectric film and a front electrode. One end of each stripe-form back electrode is made thin, bent along the side wall of the substrate and connected to a lead wire from the ultrasonic transducer. Such a connection structure allows a tight arrangement of the back electrodes while avoiding contact between the electrodes, thus providing a high resolution to the ultrasonic probe.

13 Claims, 11 Drawing Figures

LEAD STRUCTURE FOR A PIEZOELECTRIC ARRAY-TYPE ULTRASONIC PROBE

BACKGROUND OF THE INVENTION

This invention relates to an array-type ultrasonic probe using a polymeric piezoelectric film as an ultrasonic transducer element.

Ultrasonic transducers have heretofore been widely used, for example, in depth sounders, fish sounders, and ultrasonic detectors. Recently, the application of ultrasonic transducers to medical diagnostic equipments has been rapidly developed. The ultrasonic transducer for medical diagnosis is operated on a principle that an ultrasonic wave generated by the ultrasonic probe is reflected at boundaries between portions of a living body having different acoustic impedances (velocity of sound×density), and the resultant ultrasonic echo is received by the ultrasonic probe and subjected to signal-conditioning to be displayed on a cathode-ray tube. In the ultrasonic wave generating part of such an ultrasonic probe, a vibrating member comprising a piezoelectric element is used. In order to improve the resolution of sectional plane images in a deep portion of a living body, a higher frequency of ultrasonic wave is gradually required. For complying with this trend, an array-type probe is preferred, wherein the piezoelectric element is divided into a number of small and thin unit elements. The array-type probes are generally classified, according to arrangement of unit piezoelectric elements, into those of the annular-type wherein fine unit elements having shapes of annular rings with gradually different diameters are radially arranged with a small gap therebetween, and those of the linear-type wherein linear or thin bar-shaped unit elements are arranged in parallel with each other with a small gap therebetween. Among them, the linear array-type ultrasonic probe (hereinafter merely referred to as "array-type ultrasonic probe") has an advantage that piezoelectric elements can be arranged at a high density per unit area of the ultrasonic transmitting and receiving face because of its simple arrangement, whereby sectional images along the transversal direction in addition to those along the depth direction can be obtained easily and at a high resolution by electronic scanning.

Conventionally, the arrangement structure of piezoelectric elements has been produced by applying a uniform plate or film of piezoelectric element on a substrate and cutting it with constant intervals to leave a plurality of piezoelectric elements separated from each other on the substrate. However, such a process wherein a piezoelectric element per se is subjected to cutting, is accompanied with several drawbacks such as deterioration of a piezoelectric element when a polymer piezoelectric element is used in order to comply with the requirement for a thin element, ill effects due to cutting dust and limitation in cutting accuracy. For this reason, there has been proposed an array-type ultrasonic probe having a structure as shown in FIGS. 1 through 4, wherein FIG. 1 is a perspective view, FIG. 2 is a plan view and FIGS. 3 and 4 show sections taken along the lines III—III and IV—IV, respectively, in FIG. 2 viewed in the directions of the arrows. Thus, in FIGS. 1 through 4, the probe comprises a substrate 1 having a top face 1*a* and a side wall 1*b*, and piezoelectric elements 2 arranged thereon and functionally separated from each other. These piezoelectric elements 2 have a laminar structure as shown in FIG. 3 which is a sectional view, i.e., comprising a substrate 1, and a plurality of reflection plates and back electrodes 2*a* separated from and in parallel with each other, a uniform or continuous piezoelectric film 2*b* such as a polarized film of a vinylidene fluoride resin and a uniform or continuous front electrode 2*c*, successively applied onto the substrate in the order named. The front or surface electrode 2*c* is electrically connected through its extended portion 2*cc* to a lead wire 3 (FIG. 3), and a back electrode 2*a* is electrically connected to a lead wire 5 inserted through a bore 4 formed in the substrate 1 (FIG. 4). One preferable process for producing an array-type ultrasonic probe with a structure as described above has already been proposed by us (U.S. patent application Ser. No. 657,489).

We have found a difficulty with such an ultrasonic probe structure. The difficulty is one with respect to electrical connection between the back electrodes 2*a* and the lead wires 5. Thus, the connection structure is generally obtained, as shown in FIG. 5 corresponding to FIG. 4, by forming a stripe-form or bar-shaped reflection plate and back electrode 2*a*, exposing a lead wire 5 through a perforation 2*aa* formed near one end of the back electrode 5 and a bore 4 formed therebelow in the substrate 1, applying solder to join and fix the lead wire 5 and the back electrode 2*a*, and removing an excess of the solder by grinding. In order to obtain a high resolution, however, it is necessary to arrange, e.g., 1 mm-wide back electrodes 2*a* at equal gaps of the order of 0.02 to 0.1 mm. Accordingly, such small gaps can sometimes be filled with cutting dust, whereby required separation between the back electrodes 2*a* can be impaired.

SUMMARY OF THE INVENTION

In view of the above circumstances, a principal object of the present invention is to provide an array-type ultrasonic probe having a stably high resolution because of improved connection between back electrodes and the lead wires.

The present inventors, with the above object in view, first provided and examined a structure as shown in FIG. 6, wherein one end portion of a stripe-form back electrode 2*a* was extended and the extended end portion was bent along the side wall 1*b* in order to provide a connecting portion with a lead wire. In this case, however, as shown in FIG. 7 which is a partial right side view of the structure shown in FIG. 6, thickening of the width of the electrode plate 2*a* occurred at the bent portion thereof, whereby separation between the electrodes was impaired and desired performances could not be obtained. However, when an apparently similar structure as the one shown in FIG. 6 except that the extended bent portion of the electrode plate is made thinner than the remainder is used, we have observed that thickening of the width of the electrode plate does not occur even at the bending whereby desired performances can be accomplished even with small electrode gaps.

The array-type ultrasonic probe for an ultrasonic transducer according to the present invention is based on the above finding and, more particularly, comprises:

a substrate having a top face and a side wall, a plurality of stripe-form back electrodes arranged in parallel with and spaced apart from each other on the top face of the substrate, a polymer piezoelectric film applied on the plurality of back electrodes, and a front electrode on the polymer piezoelectric film, each of the plurality of stripe-form back electrodes having an end portion protruding from the top face of the substrate; the end portion being thinner than the remaining portion of each unit electrode on the substrate, bent along the side wall of the substrate and electrically connected to a lead wire from the ultrasonic transducer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
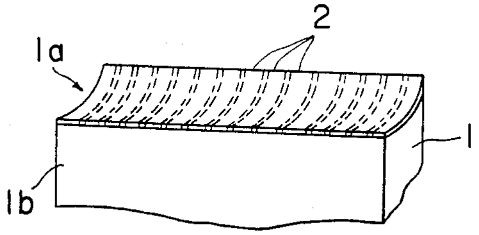
FIG. 1 is a perspective view of a linear array-type ultrasonic type which is similar to the one according to the present invention.
Figure 2:
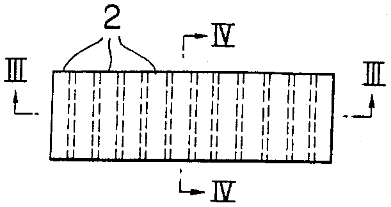
FIG. 2 is a plan view of the same.
Figure 4:
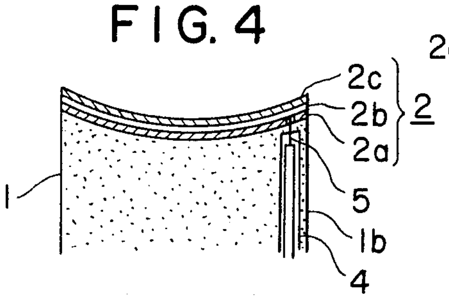
FIG. 4 is a sectional view taken along the line IV—IV and viewed in the direction of arrows which illustrates conventional structures between a back electrode and a lead wire.
Figure 3:
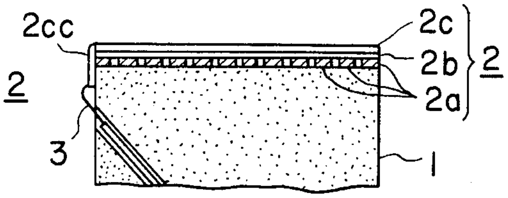
FIG. 3 is a sectional view taken along the line III—III and view in the direction of arrows in FIG. 2.
Figure 5:
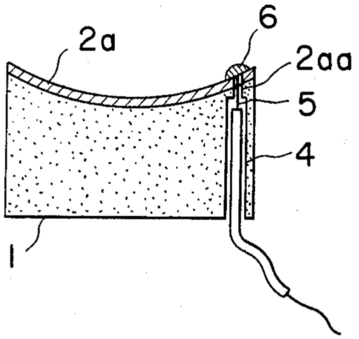
FIG. 5 illustrates an intermediate step for producing the connection shown in FIG. 4.
Figure 6:
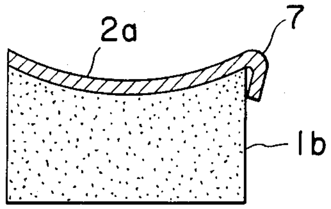
FIG. 6 illustrates another structure for connection.
Figure 7:
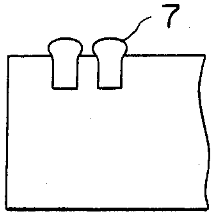
FIG. 7 is a partial right side view of the structure shown in FIG. 6.
Figure 8:
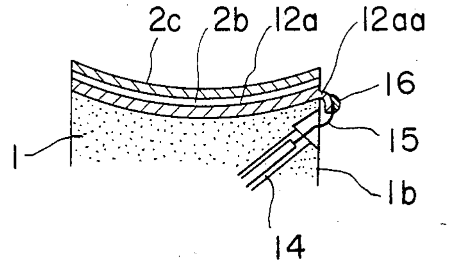
FIGS. 8 and 11 are front sectional views respectively showing an example of the linear array-type ultrasonic probe.
Figure 9:
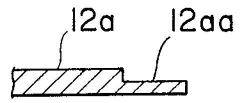
FIG. 9 is an enlarged view of an end portion of a back electrode used in the structure shown in FIG. 8.
Figure 10:
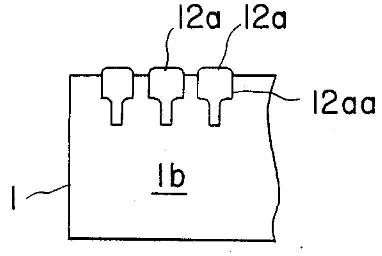
FIG. 10 is a side view showing a bent end portion of a back electrode.

FIG. 8 is a front sectional view showing an example of the ultrasonic probe according to the present invention, corresponding to FIG. 4. In this example, a stripe-form back electrode 12*a* (one of a plurality of back electrodes arranged in parallel with each other) composed of, e.g., a thin plate or bar of copper has an end portion 12*aa* protruding from a substrate 1. The protruding end portion 12*aa* is thinner than the remaining portion of the back electrode 12*a*, bent along the side wall 1*b* and connected by solder 16 to a lead wire 15 which is introduced into the substrate 1 through a bore 14 and guided to the side wall 1*b*. The stripe-form back electrode 12*a* has an end structure as shown in FIG. 9, at a stage prior to the application thereof onto the substrate 1. The thin end portion 12*aa* preferably has a thickness of the order of 20 to 50% of the portion of the electrode 12*a*, especially when the latter is in a thickness of the order of 20 to 400 microns. The end portion 12*aa* is bent along the side wall 1*b*, generally at a stage after the application of the stripe-form back electrode 12*a* and prior to the application of a piezoelectric film of, e.g., 40 microns-thick polarized polyvinylidene fluoride film and a front electrode 2*c* of, e.g., 0.05 micron-thick Al or Cu film. In this instance, because the end portion 12*aa* is made thin, the width thereof does not substantially increase by bending as shown in FIG. 10 corresponding to FIG. 7, whereby separation of adjacent electrodes are kept in a good condition.

Figure 11:
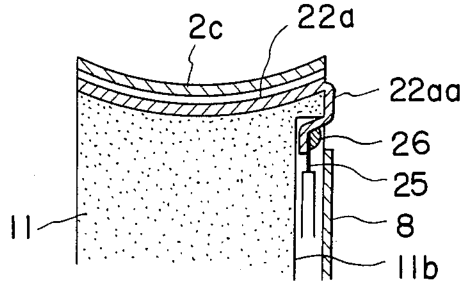

FIG. 11 is a front sectional view corresponding to FIG. 8 and showing another example of the ultrasonic probe according to the present invention. In this example, at a part of the side wall of a substrate 11 is provided a recess or cavity 11*b* in which a thin end portion 22*aa* of a back electrode 22*a* is connected to a lead wire 25 with solder 26. The lead wire 25 is covered and protected by a case 8 until it reaches the connection part. The ultrasonic probe of this example is, because the connection part is kept in the recess, allowed to have a relatively small width as a whole and is excellent in fitness to a body to be examined when it is used in a medical field. Incidentally, provided that the connection part is stored in the recess, the lead wire leading to the connecting part can be stored in a guide bore formed in a substrate as shown in FIG. 8.

The above examples refer to a case wherein a uniformly extended front electrode is used. However, it is also possible to divide the front electrode into a plurality of stripe-form electrodes, if desired, corresponding to the stripe-form back electrodes.

As described hereinabove, the present invention provides a linear array-type ultrasonic probe in which an end portion of a reflection plate and back electrode applied on a substrate is made thin, bent along the side wall and connected at the bent portion to a lead wire. With such a connection structure, unit back electrodes can be arranged at a high density and thus with small gaps therebetween while maintaining good electrical separation between the back electrodes, whereby linear-array type ultrasonic probes having a good resolution can be stably produced.

What is claimed is:

1. An array-type ultrasonic probe for an ultrasonic transducer comprising:

a substrate having a top face and a side wall, a plurality of stripe-form back electrodes arranged in parallel with and spaced apart from each other by a gap which is smaller than the width of said stripe-form back electrodes, said electrodes being arranged on the top face of the substrate, a polymer piezoelectric film applied on the plurality of back electrodes, and a front electrode on the polymer piezoelectric film, each of said plurality of stripe-form back electrodes having an end portion protruding from the top face of the substrate; said end portion being reduced in thickness as compared with the remaining portion of each back electrode on the substrate without an increase in width of the end portion, bent along the side wall of the substrate and electrically connected to a lead wire from the ultrasonic transducer.

2. The array-type ultrasonic probe according to claim 1, wherein said substrate has a bore therein and said lead wire from the ultrasonic transducer is stored in the bore until just before the connecting portion thereof with said end portion of the stripe-form back electrode.

3. The array-type ultrasonic probe according to claim 1, wherein said substrate has a recess in the side wall below the top face, and the connection between the end portion of the back electrode and the lead wire is stored in the recess.

4. The array-type ultrasonic probe according to claim 1, wherein said end portion of the back electrode has a thickness which is 20 to 50% of that of the portion of the back electrode on the substrate.

5. The array-type ultrasonic probe according to claim 1, wherein the portion of the back electrode on the substrate has a thickness in the range of 20 to 400 microns.

6. The array-type ultrasonic probe according to claim 1, wherein said plurality of back electrodes respectively have a width of the order of 1 mm and are arranged at a gap of the order of 0.02 to 0.1 mm.

7. The array-type ultrasonic probe according to claim 1, wherein said polymer piezoelectric film comprises a polarized film of a vinylidene fluoride resin.

8. An array-type ultrasonic probe for an ultrasonic transducer comprising:

a substrate having a top face and a side wall, a plurality of stripe-form back electrodes arranged in parallel with and spaced apart from each other on the top face of the substrate, a polymer piezoelectric film applied on the plurality of back electrodes, and a front electrode on the polymer piezoelectric film, each of said plurality of stripe-form back electrodes having an end portion protruding from the top face of the substrate; said end portion being thinner than the remaining portion of each back electrode on the substrate bent along the side wall of the substrate and electrically connected to a head wire from the ultrasonic transducer;

wherein said end portion of the back electrodes has a thickness which is 20 to 50 percent of that of the portion of the back electrode of the substrate.

9. The array-type ultrasonic probe according to claim 8, wherein said substrate has a bore therein and said lead wire from the ultrasonic transducer is stored in the bore until just before the connecting portion thereof with said end portion of the stripe-form back electrode.

10. The array-type ultrasonic probe according to claim 8, wherein said substrate has a recess in the side wall below the top face, and the connection between the end portion of the back electrode and the lead wire is stored in the recess.

11. The array-type ultrasonic probe according to claim 8, wherein the portion of the back electrode on the substrate has a thickness in the range of 20 to 400 microns.

12. The array-type ultrasonic probe according to claim 8, wherein said plurality of back electrode respectively have a width of the order of 1 mm and are arranged at a gap of the order to 0.02 to 0.1 mm.

13. The array-type ultrasonic probe according to claim 8, wherein said polymer piezoelectric film comprises a polarized film of a vinylidene fluoride resin.

* * * * *